(12) United States Patent
Lim et al.

(10) Patent No.: US 11,063,075 B2
(45) Date of Patent: Jul. 13, 2021

(54) SEMICONDUCTOR IMAGE SENSOR INCLUDING SEPARATE LOW-VOLTAGE AND HIGH-VOLTAGE REGIONS

(71) Applicant: SAMSUNG ELECTRONICS CO., LTD., Suwon-si (KR)

(72) Inventors: Jung Wook Lim, Hwaseong-si (KR); Dong Joo Yang, Seongnam-si (KR); Sung Soo Choi, Hwaseong-si (KR); Doo Sik Seol, Seoul (KR); Seung Ki Jung, Bucheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/433,568

(22) Filed: Jun. 6, 2019

(65) Prior Publication Data

US 2020/0111827 A1 Apr. 9, 2020

(30) Foreign Application Priority Data

Oct. 8, 2018 (KR) .................. 10-2018-0119518

(51) Int. Cl.
*H01L 27/146* (2006.01)
*H01L 27/32* (2006.01)
*H01L 51/50* (2006.01)
*H01L 51/52* (2006.01)

(52) U.S. Cl.
CPC .... *H01L 27/14612* (2013.01); *H01L 27/1463* (2013.01); *H01L 27/14603* (2013.01); *H01L 27/14636* (2013.01); *H01L 27/3218* (2013.01); *H01L 27/3246* (2013.01); *H01L 51/504* (2013.01); *H01L 51/5253* (2013.01)

(58) Field of Classification Search
CPC ......... H01L 27/14612; H01L 27/14603; H01L 27/1463; H01L 27/14636
See application file for complete search history.

(56) References Cited

U.S. PATENT DOCUMENTS

| 6,218,691 | B1 | 4/2001 | Chung et al. |
| 7,244,632 | B2 | 7/2007 | Min |
| 7,787,038 | B2 | 8/2010 | Mabuchi |
| 8,952,475 | B2 | 2/2015 | Oh et al. |
| 9,281,328 | B2 | 3/2016 | Ohno et al. |
| 9,496,304 | B2 | 11/2016 | Hu et al. |
| 9,524,995 | B2 | 12/2016 | Koo et al. |
| 2010/0140733 | A1 | 6/2010 | Lee et al. |

(Continued)

FOREIGN PATENT DOCUMENTS

| JP | 2003-218337 | 7/2003 |
| JP | 2010-103547 | 5/2010 |

*Primary Examiner* — Matthew E. Gordon
(74) *Attorney, Agent, or Firm* — F. Chau & Associates, LLC

(57) ABSTRACT

A semiconductor device including: a substrate having a first surface and a second surface facing the first surface, wherein light is incident on the second surface; a pixel region formed in the substrate; a semiconductor photoelectric converter disposed in the pixel region and the substrate; one or more transistors disposed in the pixel region and at the first surface of the substrate, wherein the one or more transistors do not overlap the semiconductor photoelectric converter; and a separation pattern disposed in the pixel region and surrounding the one or more transistors.

9 Claims, 18 Drawing Sheets

(56) References Cited

U.S. PATENT DOCUMENTS

2017/0125474 A1\* 5/2017 Roy .................. H01L 27/14643
2017/0170229 A1   6/2017 Oh et al.
2017/0207267 A1   7/2017 Park et al.
2018/0007293 A1   1/2018 Maruyama et al.

\* cited by examiner

SEMICONDUCTOR IMAGE SENSOR INCLUDING SEPARATE LOW-VOLTAGE AND HIGH-VOLTAGE REGIONS

This application claims priority under 35 U.S.C. § 119 to Korean Patent Application No. 10-2018-0119518, filed on Oct. 8, 2018, in the Korean Intellectual Property Office, the disclosure of which is incorporated by reference herein in its entirety.

1. TECHNICAL FIELD

The present inventive concept relates to a semiconductor device.

2. DESCRIPTION OF THE RELATED ART

As semiconductor devices decrease in size and increase in performance, they are driven with a low voltage. While a semiconductor device is driven with a low voltage, some transistors within the semiconductor device may need a higher voltage. In such a semiconductor device, voltages of different levels are applied to a region in which the low driving voltage transistors are disposed and a region in which the high driving voltage transistors are disposed.

SUMMARY

According to an exemplary embodiment of the present inventive concept, there is provided a semiconductor device comprising: a substrate having a first surface and a second surface facing the first surface, wherein light is incident on the second surface; a pixel region formed in the substrate; a semiconductor photoelectric converter disposed in the pixel region and the substrate; one or more transistors disposed in the pixel region and at the first surface of the substrate, wherein the one or more transistors do not overlap the semiconductor photoelectric converter; and a separation pattern disposed in the pixel region and surrounding the one or more transistors.

According to an exemplary embodiment of the present inventive concept, there is provided a semiconductor device comprising: a substrate comprising a first region, a second region, a first surface and a second surface, the first region comprising a first pixel group, the second region comprising a second pixel group, the second surface facing the first surface and having light incident thereon; a separation pattern surrounding the first region and separating the first region from the second region; and a connection wiring structure connecting the first region to a negative voltage applying power source.

According to an exemplary embodiment of the present inventive concept, there is provided a semiconductor device comprising: a substrate which comprises a first region, a second region and a first surface and a second surface facing each other; a gate electrode disposed at the first surface of the first region; a source/drain region disposed at the first surface of the first region and disposed on at least one side of the gate electrode; a separation pattern surrounding the first region to separate the first region from the second region, wherein the separation pattern penetrates the substrate and extends from the first surface of the substrate to the second surface of the substrate; and a connection wiring structure connecting the first region to a power source that can apply a negative voltage.

According to an exemplary embodiment of the present inventive concept, there is provided a semiconductor device comprising: a substrate having a first surface and a second surface facing the first surface; a pixel region formed in the substrate; a semiconductor photoelectric converter disposed in the pixel region and the substrate; a first transistor disposed in the pixel region and at the first surface of the substrate, wherein the first transistor does not overlap the semiconductor photoelectric converter; a connection wiring structure disposed in the pixel region and connecting the first transistor to a power source; and a separation pattern surrounding the first transistor and the connection wiring structure.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EMBODIMENTS

Figure 1:
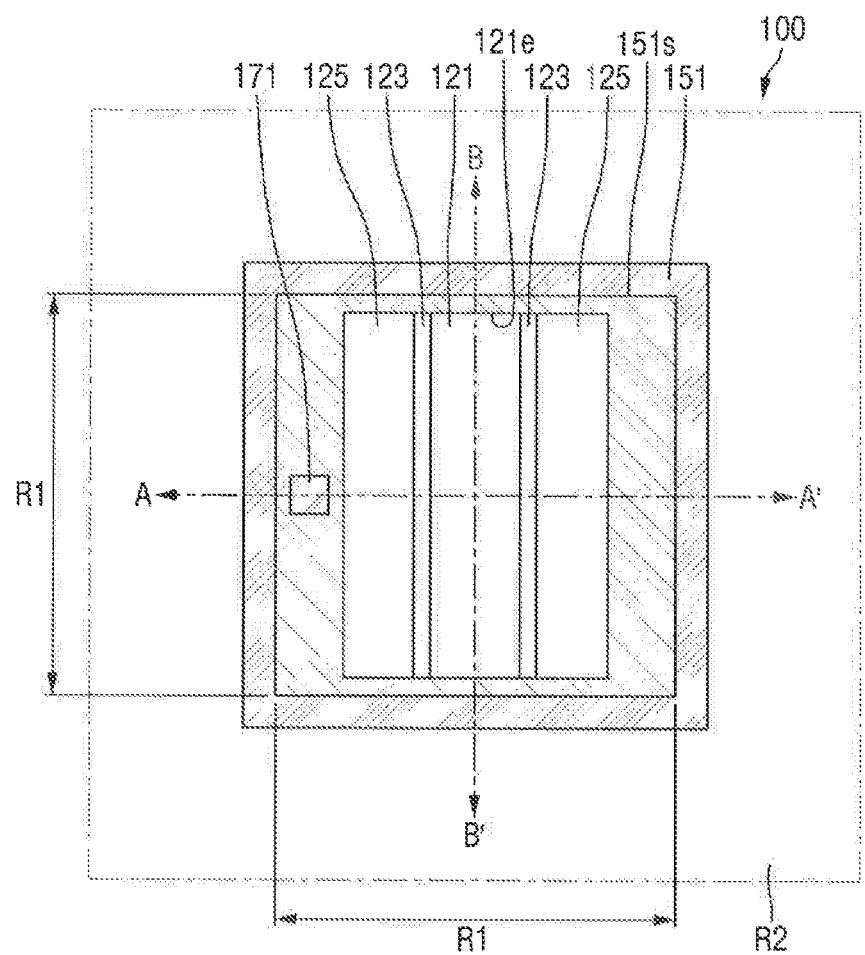
FIG. 1 is a plan view of a semiconductor device according to exemplary embodiments of the present inventive concept.

In the drawings, semiconductor devices according to exemplary embodiments of the present inventive concept are illustrated with a planar transistor by way of example. However, the semiconductor devices according to the exemplary embodiments of the present inventive concept may also include a fin field effect transistor (FinFET), a tunneling FET, a transistor including nanowires, a transistor including a nanosheet, or a three-dimensional (3D) transistor. In addition, the semiconductor devices according to the exemplary embodiments of the present inventive concept may include a bipolar junction transistor, a lateral double diffusion transistor (LDMOS), or the like.

A semiconductor device according to exemplary embodiments of the present inventive concept will now be described with reference to FIGS. 1 through 3.

FIG. 1 is a plan view of a semiconductor device according to exemplary embodiments of the present inventive concept. In FIG. 1, a first connection wiring 171b is omitted for clarity. FIG. 2 is a cross-sectional view taken along line A-A' of FIG. 1. FIG. 3 is a cross-sectional view taken along line B-B' of FIG. 1.

Figure 2:
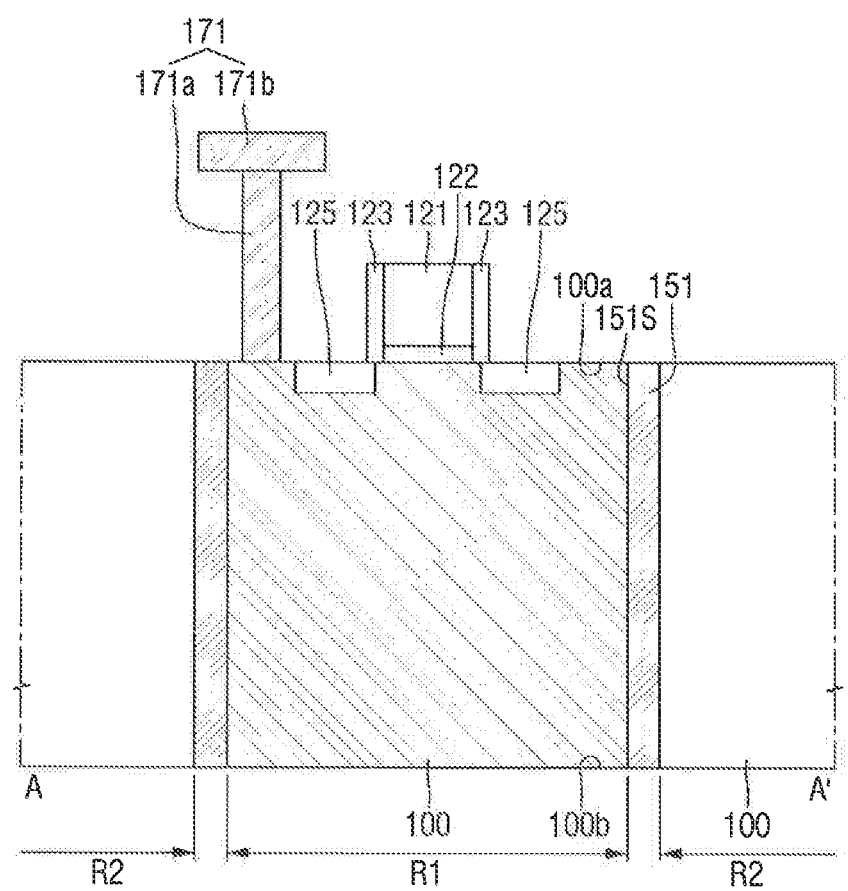
FIG. 2 is a cross-sectional view taken along line A-A' of FIG. 1.
Figure 3:
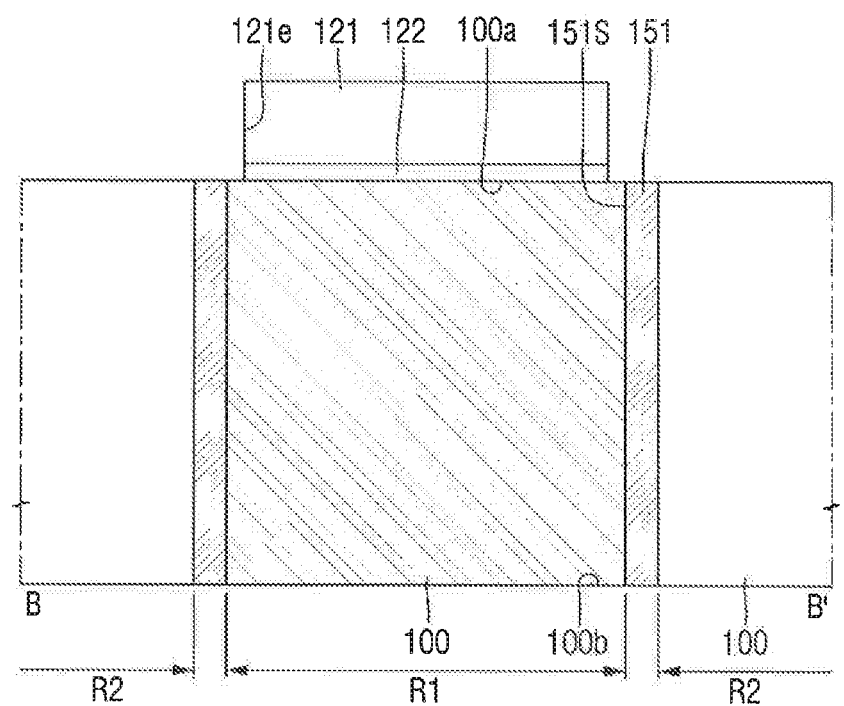
FIG. 3 is a cross-sectional view taken along line B-B' of FIG. 1.

Referring to FIGS. 1 through 3, a substrate 100 of the semiconductor device according to the exemplary embodiments of the present inventive concept may include a first region R1 and a second region R2 separated by a first separation pattern 151.

The substrate 100 may be, for example, a bulk silicon substrate or a silicon-on-insulator (SOI) substrate. The substrate 100 may also be a silicon substrate or a substrate made of another material such as silicon germanium, indium antimonide, lead telluride, indium arsenide, indium phosphide, gallium arsenide, or gallium antimonide. Alternatively, the substrate 100 may consist of a base substrate and an epitaxial layer formed on the base substrate.

The substrate 100 may include the first region R1 and the second region R2. The first region R1 of the substrate 100 may be a closed region formed by the first separation pattern 151. The second region R2 of the substrate 100 may be a region of the substrate 100 excluding the first region R1. The substrate 100 may include a first surface 100a and a second surface 100b facing each other. A gate electrode 121 may be disposed at the first surface 100a of the substrate 100. The gate electrode 121 may be disposed, for example, on the first surface 100a of the substrate 100.

The gate electrode 121, a gate insulating layer 122, gate spacers 123, source/drain regions 125, and a first connection wiring structure 171 may be disposed in the first region R1 of the substrate 100.

An end 121e of the gate electrode 121 may be spaced apart from the first separation pattern 151. For example, the end 121e of the gate electrode 121 may be spaced apart from a sidewall 151S of the first separation pattern 151. Therefore, a part of the first region R1 of the substrate 100 may be exposed between the end 121e of the gate electrode 121 and the first separation pattern 151. Alternatively, the end 121e of the gate electrode 121 may coincide with the sidewall 151S of the first separation pattern 151. In other words, the end 121e of the gate electrode 121 may be collinear with the sidewall 151S of the first separation pattern 151.

The gate electrode 121 may include a conductive material. Although the gate electrode 121 is illustrated as a single layer, the present inventive concept is not limited to this case. For example, the gate electrode 121 may include a work function conductive layer for controlling a work function and a filling conductive layer for filling a space formed by the work function conductive layer. The gate electrode 121 may include, for example. TiN, WN, TaN, Ru, TiC, TaC, Ti, Ag, Al, TiAl, TiAlN, TiAlC, TaCN, TaSiN, Mn, Zr, W, or Al. Alternatively, the gate electrode 121 may be made of a non-metallic material such as Si or SiGe.

The gate insulating layer 122 may be disposed between the gate electrode 121 and the first surface 100a of the first region R1 of the substrate 100. The gate insulating layer 122 may not extend, for example, between the gate electrode 121 and the gate spacers 123.

The gate insulating layer 122 may include silicon oxide, silicon oxynitride, silicon nitride, or a high-k material having a higher dielectric constant than silicon oxide. The high-k material may include, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate. Although the gate insulating layer 122 has been described above as including an oxide, the present inventive concept is not limited to this case. The gate insulating layer 122 may also include, but is not limited to, a nitride (e.g., hafnium nitride) of a metallic material or an oxynitride (e.g., hafnium oxynitride) of a metallic material.

The gate spacers 123 may be disposed on both sidewalls of the gate electrode 121. The gate spacers 123 may be disposed on the first surface 100a of the first region R1 of the substrate 100. The gate spacers 123 may include, for example, silicon nitride (SiN), silicon oxynitride (SiON), silicon oxide ($SiO_2$), silicon oxycarbonitride (SiOCN), or combinations of these materials.

The source/drain regions 125 may be disposed on at least one side of the gate electrode 121. The source/drain regions 125 may be disposed on the first surface 100a of the first region R1 of the substrate 100. The source/drain regions 125 may be disposed, for example, within the substrate 100. The shape of the source/drain regions 125 is not limited to that illustrated in FIG. 2. For example, bottom surfaces of the source/drain regions 125 may be curved.

If a transistor to be formed is a p-channel metal oxide semiconductor (PMOS) transistor, the source/drain regions 125 may include a compressive stress material. For example, the compressive stress material may be a material (e.g., SiGe) having a greater lattice constant than Si. The compressive stress material can improve the mobility of carriers in a channel region by applying compressive stress to the source/drain regions 125.

If the transistor to be formed is an n-channel metal oxide semiconductor (NMOS) transistor, the source/drain regions 125 may include the same material as the substrate 100 or a tensile stress material. For example, when the substrate 100 is Si, the source/drain regions 125 may be Si or a material (e.g., SiC) having a smaller lattice constant than Si.

The source/drain regions 125 may further include impurities.

The first separation pattern 151 may surround the gate electrode 121, the gate insulating layer 122, the gate spacers 123, the source/drain regions 125 and the first connection wiring structure 171. In other words, the first separation pattern 151 may surround the first region R1 of the substrate 100 and separate the first region R of the substrate 100 from the second region R2 of the substrate 100. The first separation pattern 151 may have, for example, a closed structure.

The first separation pattern 151 may penetrate the substrate 100 to extend from the first surface 100a to the second surface 100b. Therefore, as described above, the first region R1 of the substrate 100 may be a closed region formed by the first separation pattern 151.

The first separation pattern 151 may include an insulating material. The first separation pattern 151 may electrically insulate the first region R1 of the substrate 100 from the second region R2 of the substrate 100. Therefore, a voltage applied to the first region R1 of the substrate 100 may not be applied to the second region R2 of the substrate 100 due to the first separation pattern 151.

In exemplary embodiments of the present inventive concept, the first connection wiring structure 171 may be disposed on the first surface 100a of the first region R1 of the substrate 100. The first connection wiring structure 171 may be disposed on the first surface 100a of the first region R1 of the substrate 100 exposed between a source/drain region 125 and the first separation pattern 151. The first connection wiring structure 171 may directly contact the first surface 100a of the first region R1 of the substrate 100. The first connection wiring structure 171 may be spaced apart from each of the source/drain region 125 and the first separation pattern 151. The first connection wiring structure 171 may not be connected to the second region R2 of the substrate 100.

In exemplary embodiments of the present inventive concept, the first connection wiring structure 171 may include a first contact 171a and the first connection wiring 171b. The first contact 171a of the first connection wiring structure 171 may directly contact, for example, the first surface 100a of the first region R1 of the substrate 100. The first contact 171a of the first connection wiring structure 171 may extend vertically from the first surface 100a of the substrate 100. The first connection wiring 171b of the first connection wiring structure 171 may be disposed on the first contact 171a. The first connection wiring structure 171 may include a conductive material.

The first connection wiring structure 171 may connect the first region R1 of the substrate 100 to a power source that can apply a negative voltage. For example, when the semiconductor device according to the exemplary embodiments of the present inventive concept is driven, a negative voltage, in other words, a negative bias, may be applied to the first region R1 of the substrate 100 through the first connection wiring structure 171. In addition, the first connection wiring structure 171 is not connected to the second region R2 of the substrate 100, and the first region R1 of the substrate 100 is insulated from the second region R2 by the first separation pattern 151. Therefore, a voltage (e.g., a negative voltage) applied to the first region R1 may not be applied to the second region R2 of the substrate 100.

In the semiconductor device according to the exemplary embodiments of the present inventive concept, since the first region R1 of the substrate 100 and the second region R2 of the substrate 100 are separated using the first separation pattern 151, a voltage of a specific level, for example, a negative voltage, can be applied only to the first region R1 of the substrate 100 through the first connection wiring structure 171. For example, the first region R1 of the substrate 100 may be a region in which transistors driven with a high voltage are formed, and the second region R2 of the substrate 100 may be a region in which transistors driven with a low voltage are formed. In this case, since the first region R1 and the second region R2 of the substrate 100 are insulated from each other by the first separation pattern 151, a negative voltage may be applied only to the first region R1 of the substrate 100. Therefore, a driving voltage for the transistors formed in the first region R1 of the substrate 100 may be reduced, and thus, the transistors may be driven at a low voltage. In addition, a threshold voltage may be increased, thereby reducing a leakage current.

A semiconductor device according to exemplary embodiments of the present inventive concept will now be described with reference to FIGS. 1, 3 and 4. For clarity of description, a description of elements identical to those described above will be omitted or given briefly.

Figure 4:
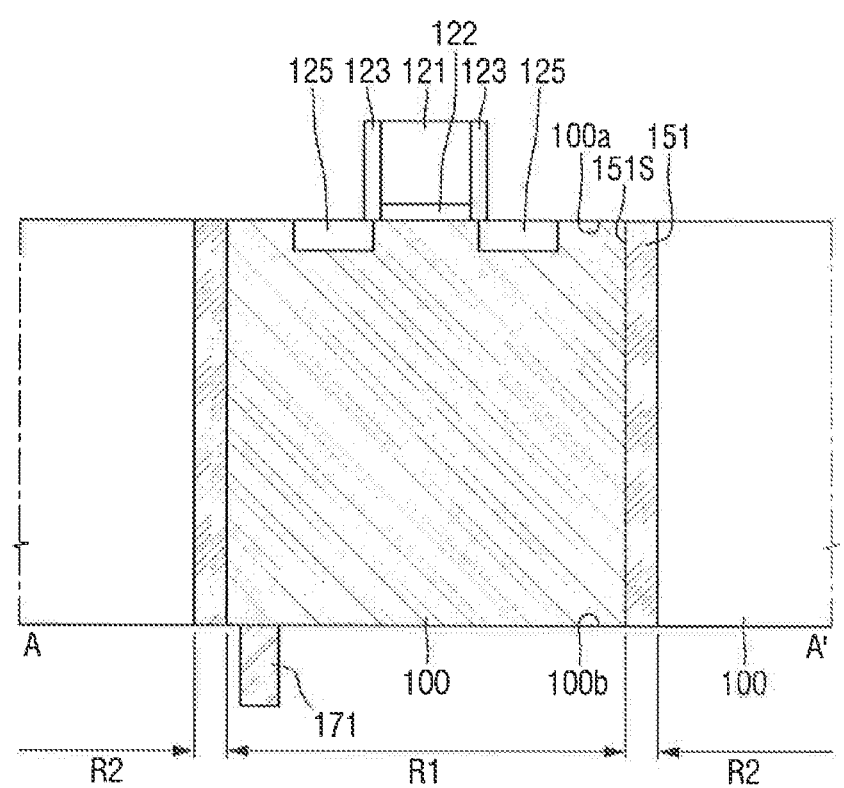
FIG. 4 is a cross-sectional view taken along line A-A' of FIG. 1.

FIG. 4 is a cross-sectional view taken along line A-A' of FIG. 1. Referring to FIGS. 1, 3 and 4, a first connection wiring structure 171 of the semiconductor device according to the exemplary embodiments of the present inventive concept may be disposed on a second surface 100b of a first region R1 of a substrate 100. The first connection wiring structure 171 may, for example, directly contact the second surface 100b of the first region R1 of the substrate 100 which is a closed region formed by a first separation pattern 151.

Although the first connection wiring structure 171 is illustrated as not including a first connection wiring (e.g., 171b in FIG. 2), exemplary embodiments of the present inventive concept are not limited to this case. For example, the first connection wiring structure 171 which directly contacts the second surface 100b of the first region R1 may include the first connection wiring 171b shown in FIG. 2.

The first connection wiring structure 171 can be disposed at any position on the second surface 100b of the first region R1 of the substrate 100 as long as it can directly contact the second surface 100b of the first region R1 of the substrate 100.

A semiconductor device according to exemplary embodiments of the present inventive concept will now be described with reference to FIGS. 5 through 10. For clarity of description, a description of elements identical to those described above will be omitted or given briefly.

Figure 5:
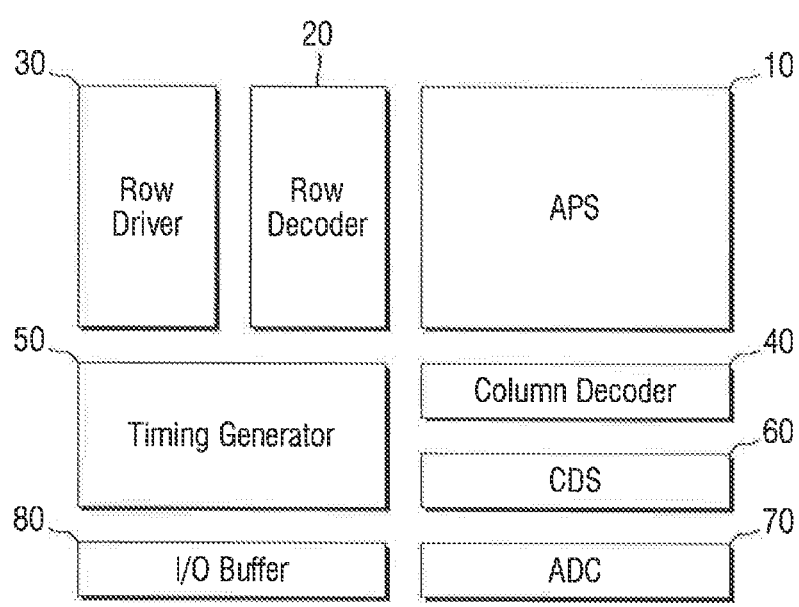
FIG. 5 is a block diagram of a semiconductor device according to exemplary embodiments of the present inventive concept.

FIG. 5 is a block diagram of a semiconductor device according to exemplary embodiments of the present inventive concept. The semiconductor device according to the exemplary embodiments of the present inventive concept may be an image sensor. The image sensor may include, for example, the structure described above with reference to FIGS. 1 through 4.

The image sensor which is the semiconductor device according the exemplary embodiments of the present inventive concept includes an active pixel sensor (APS) array 10, a row decoder 20, a row driver 30, a column decoder 40, a timing generator 50, a correlated double sampler (CDS) 60, an analog-to-digital converter (ADC) 70, and an input/output (I/O) buffer 80.

The APS array 10 may include a plurality of unit pixel regions arranged two-dimensionally and convert optical signals into electrical signals. The APS array 10 may be driven by a plurality of driving signals (such as a pixel selection signal, a reset signal, and a charge transfer signal) received from the row driver 30. In addition, the electrical signals output from the APS array 10 may be provided to the CDS 60.

The row driver 30 may provide the APS array 10 with a plurality of driving signals for driving the unit pixel regions according to the decoding result of the row decoder 20. When the unit pixel regions are arranged in a matrix, the driving signals may be provided to each row of the APS array 10. The timing generator 50 may provide a timing signal and a control signal to the row decoder 20 and the column decoder 40. The CDS 60 may receive the electrical signals generated by the APS array 10 and hold and sample the received electrical signals. The CDS 60 may double-sample a specific noise level and signal levels of the electrical signals and output difference levels between the noise level and the signal levels.

The ADC 70 may convert analog signals corresponding to the difference levels output from the CDS 60 into digital signals and output the digital signals. The I/O buffer 80 may latch the digital signals and sequentially output the latched signals to an image signal processor according to the decoding result of the column decoder 40.

Figure 6:
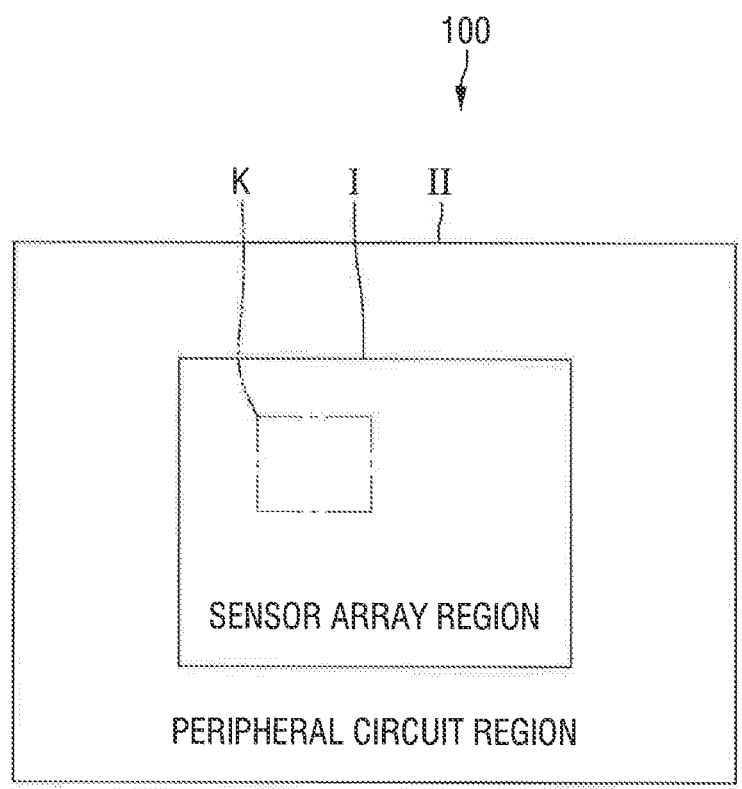
FIG. 6 illustrates regions of a substrate of a semiconductor device according to exemplary embodiments of the present inventive concept.

FIG. 6 illustrates regions of a substrate 100 of the semiconductor device according to the exemplary embodiments of the present inventive concept. Referring to FIG. 6, a peripheral circuit region II may be a region in which, for example, the CDS 60, the ADC 70, the column decoder 40, the I/O buffer, 80, the timing generator 50, the row driver 30 and the row decoder 20 illustrated in FIG. 5 are disposed.

A sensor array region I may be a region in which, for example, the APS array 10 illustrated in FIG. 5 is disposed. The APS array 10 of the sensor array region I may include a plurality of pixel regions. In other words, each of the pixel regions may be a region formed in the substrate 100. The peripheral circuit region II may surround the sensor array region I. However, the present inventive concept is not limited to this case. For example, only the sensor array region I may be formed in the substrate 100, and the peripheral circuit region II may be formed in a lower substrate, or another substrate.

Figure 7:
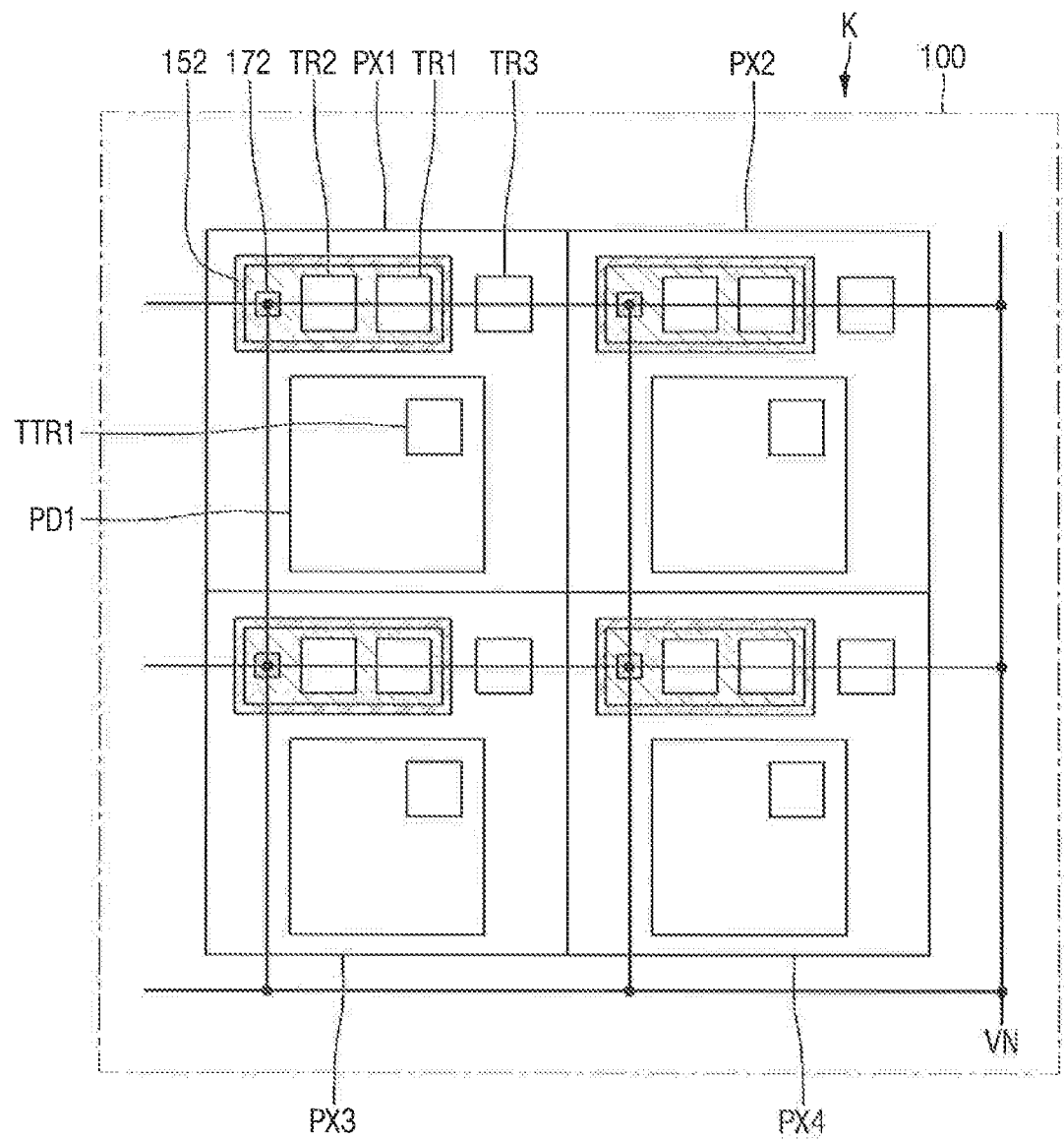
FIG. 7 is an enlarged view of an area K of FIG. 6.
Figure 8:
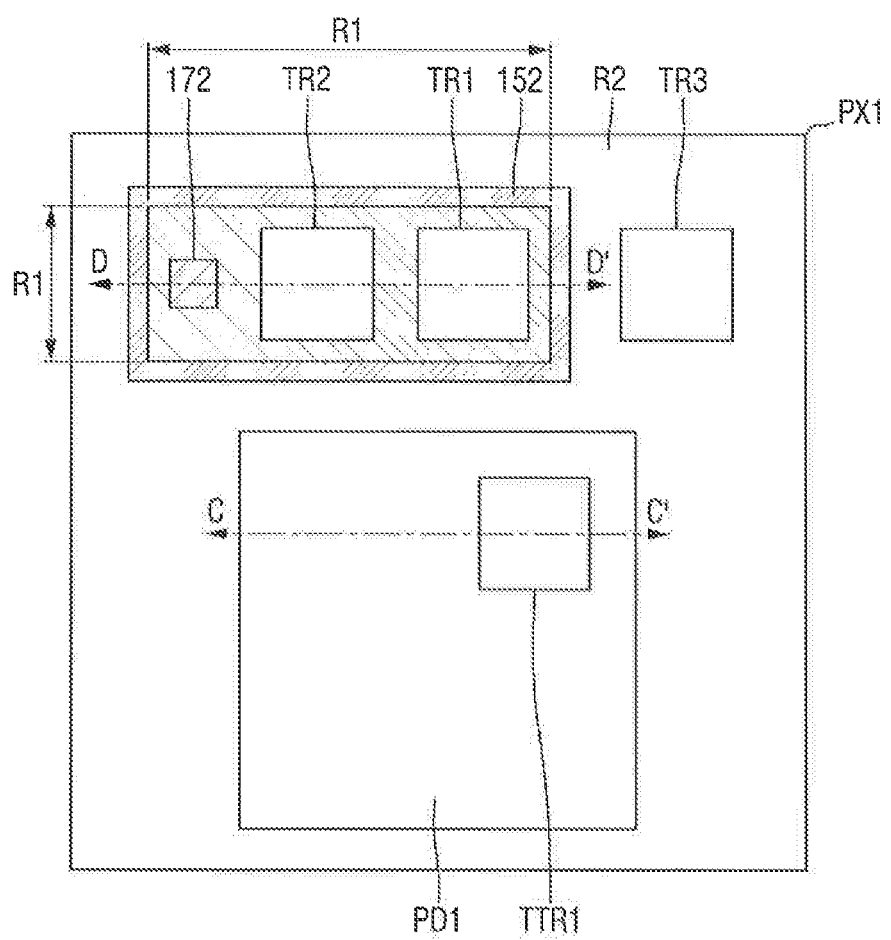
FIG. 8 is a plan view of a first pixel region of FIG. 7.

FIG. 7 is an enlarged view of an area K of FIG. 6. The area K of FIG. 6 may include some of the pixel regions included in the APS array 10 of the sensor array region I. FIG. 8 is a plan view of a first pixel region PX1 of FIG. 7. In FIGS. 7 and 8, a second connection wiring 172b (see FIG. 10) of a second connection wiring structure 172 is omitted for clarity. Referring to FIGS. 7 and 8, the area K may include, for example, first through fourth pixel regions PX1, PX2, PX3 and PX4. Since the second through fourth pixel regions PX2 through PX4 may be the same as the first pixel region PX1, only the first pixel region PX1 will be described below.

The first pixel region PX1 may include, for example, a first semiconductor photoelectric converter PD1, a first transmission transistor TTR1, a first transistor TR1, a second transistor TR2, a third transistor TR3, a second separation pattern 152, and the second connection wiring structure 172.

The first semiconductor photoelectric converter PD1 and the first transmission transistor TTR1 may overlap each other. The first through third transistors TR1 through TR3 may be spaced apart from each other. The first through third transistors TR1 through TR3 may not overlap the first semiconductor photoelectric converter PD1.

The second separation pattern 152 may be disposed in the first pixel region PX1 and surround at least one transistor. For example, the second separation pattern 152 may surround the first transistor TR1, the second transistor TR2, and the second connection wiring structure 172. The second separation pattern 152 may surround a region of the substrate 100 in which the first transistor TR1, the second transistor TR2 and the second connection wiring structure 172 are formed, thereby forming a first region R1 of the substrate 100 which is a closed region. In other words, the second separation pattern 152 may surround the first region R1 of the substrate 100 to separate the first region R1 of the substrate 100 from a second region R2 of the substrate 100. The second separation pattern 152 may electrically insulate the first region R1 and the second region R2 of the substrate 100. The first region R1 formed by the second separation pattern 152 may be a part of the first pixel region PX1 formed in the substrate 100. The second separation pattern 152 may have a closed structure. The description of the first separation pattern 151 is applicable to the second separation pattern 152. For example, like the first separation pattern 151, the second separation pattern 152 may include an insulating material.

The second region R2 of the substrate 100 may be a region of the first pixel region PX1 excluding the first region R1. For example, the first semiconductor photoelectric converter PD1), the first transmission transistor TTR1, and the third transistor TR3 may be disposed in the second region R2 of the substrate 100.

In exemplary embodiments of the present inventive concept, the second separation pattern 152 may not surround the first semiconductor photoelectric converter PD1 and the first transmission transistor TTR1.

Although the second separation pattern 152 surrounds two transistors in FIGS. 7 and 8, the present inventive concept is not limited to this case. For example, the second separation pattern 152 may surround any number of transistors among the transistors TR1 through TR3 excluding the first transmission transistor TTR1.

The second connection wiring structure 172 may be disposed, for example, in the first region R1 of the substrate 100. The second connection wiring structure 172 may connect the first region R1 of the substrate 100 to a power source that can apply a negative voltage VN. For example, the respective second connection wiring structures 172 of the first through fourth pixel regions PX1 through PX4 may be connected to each other, so that the negative voltage VN can be applied to the first region R1 of the substrate 100 in each of the first through fourth pixel regions PX1 through PX4. The second connection wiring structure 172 may be disposed in the first region R1 of the substrate 100 to directly contact the substrate 100. The second connection wiring structure 172 will be described in more detail later with reference to FIG. 10.

Figure 9:
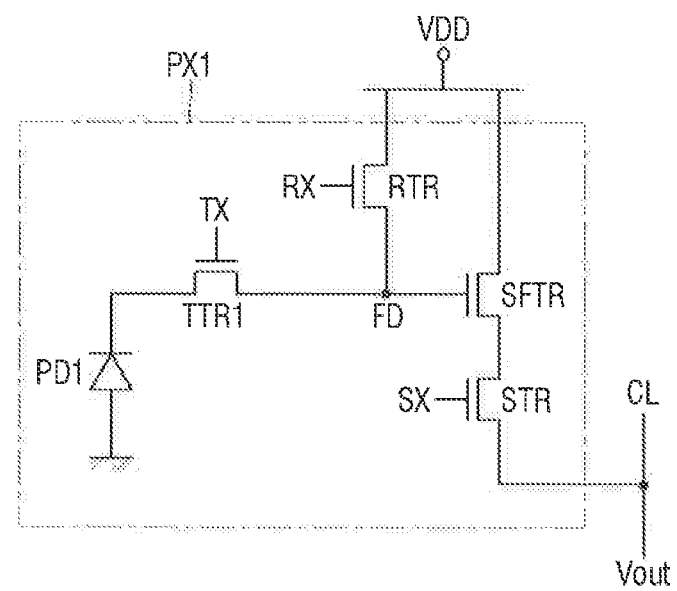
FIG. 9 is a circuit diagram corresponding to the first pixel region of FIG. 8.

FIG. 9 is a circuit diagram corresponding to the first pixel region PX1 of FIG. 8. Referring to FIG. 9, the first pixel region PX1 may include the first semiconductor photoelectric converter PD1, the first transmission transistor TTR1, a reset transistor RTR, a source follower transistor SFTR, and a selection transistor STR.

An end of the first transmission transistor TTR1 may be connected to the first semiconductor photoelectric converter PD1, and the other end of the first transmission transistor TTR1 may be connected to a floating diffusion region FD. A transmission gate of the first transmission transistor TR1 may be gated by a transmission control signal TX. The transmission gate of the first transmission transistor TTR1 may transmit an optical signal, which is an electric charge generated by the first semiconductor photoelectric converter PD1, to the floating diffusion region FD according to the transmission control signal TX.

The floating diffusion region FD may receive and cumulatively store optical signals.

An end of the reset transistor RTR may be connected to a power supply voltage $V_{DD}$, and the other end of the reset transistor RTR may be connected to the floating diffusion region FD. A reset gate of the reset transistor RTR may be gated by a reset control signal RX. The reset transistor RTR may reset the floating diffusion region FD to the power supply voltage $V_{DD}$. An end of the source follower transistor SFTR may be connected to the power supply voltage $V_{DD}$, and the other end of the source follower transistor SFTR may be connected to an end of the selection transistor STR. The source follower transistor SFTR may be a driving transistor that is controlled by the floating diffusion region FD to generate an output voltage. The source follower transistor SFTR may be combined with a constant current source located outside the first pixel region PX1 to serve as a source follower buffer amplifier. The source follower transistor SFTR may amplify a potential change at the floating diffusion region FD and generate an output voltage Vout.

The output voltage Vout may be output to the selection transistor STR from the source follower transistor SFTR. The end of the selection transistor STR may be connected to the other end of the source follower transistor SFTR, and the other end of the selection transistor STR may be connected to a column line CL. The selection transistor STR may be gated by a selection control signal SX. The selection transistor STR may output the output voltage Vout to the column line CL connected to the first pixel region PX1.

The transmission control signal TX, the reset control signal RX, and the selection control signal SX may be output from the row driver 30 of FIG. 5.

In exemplary embodiments of the present inventive concept, the first transistor TR1 (of FIG. 8) may be the reset transistor RTR, and the second transistor TR2 (of FIG. 8) may be the selection transistor STR. In addition, the third transistor TR3 (of FIG. 8) may be the selection transistor STR.

Although FIGS. 7 and 8 show that one pixel region includes all of the first through third transistors R1 through TR3, the present inventive concept is not limited to this case. A certain number of pixel regions among a plurality of pixel regions may form a unit pixel region, in which case at least any one of the first through third transistors TR1 through TR3 may be shared by the unit pixel region. For example, if the first and second pixel regions PX1 and PX2 among a plurality of pixel regions form a unit pixel region, each of the first and second pixel regions PX1 and PX2 may include the first semiconductor photoelectric converter PD1 and the first transmission transistor TTR1, but each of the first and second pixel regions PX1 and PX2 may include only one of the first through third transistors TR1 through TR3. In this case, the first and second transistors TR1 and TR2 may still be surrounded by the second separation pattern 152.

Figure 10:
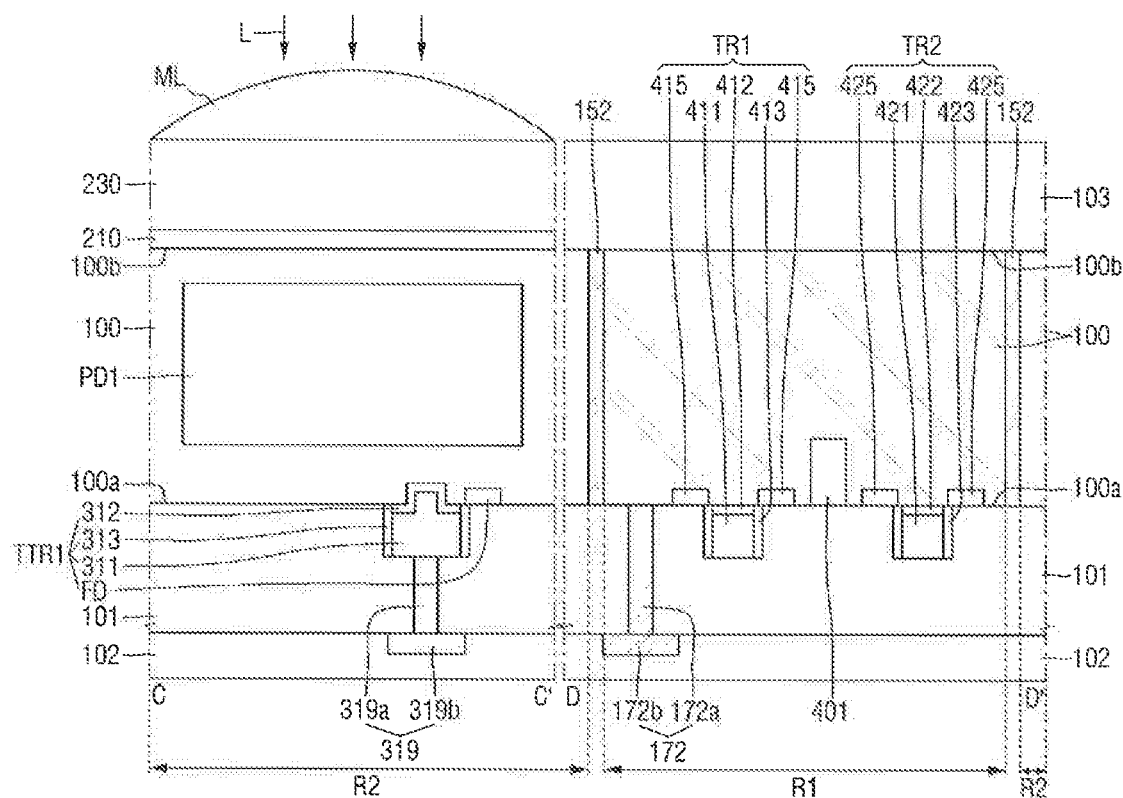
FIGS. 10 and 11 are cross-sectional views taken along lines C-C' and D-D' of FIG. 8, respectively.

FIG. 10 is a cross-sectional view taken along lines C-C' and D-D' of FIG. 8. Referring to FIG. 10, the first pixel region PX1 may include a first interlayer insulating film 101, a second interlayer insulating film 102, a third interlayer insulating film 103, a first transmission gate connection structure 319, a protective planarization layer 210, a color filter layer 230, and a microlens ML.

A second surface 100b of the substrate 100 may be a surface on which light L is incident.

The first interlayer insulating film 101 and the second interlayer insulating film 102 may be disposed over the first region R1 and the second region R2 of the substrate 100. The first interlayer insulating film 101 may be disposed on a first surface 100a of the substrate 100. The first interlayer insulating film 101 may be disposed between the second interlayer insulating film 102 and the first surface 100a of the substrate 100.

The first interlayer insulating film 101 may include a first gate electrode 411, a second gate electrode 421, at least a part of a second connection wiring structure 172, at least a part of a first transmission gate electrode 311, and at least a part of the first transmission gate connection structure 319. The second interlayer insulating film 102 may include at least a part of the second connection wiring structure 172 and at least a part of the first transmission gate connection structure 319.

The first interlayer insulating film 101 and the second interlayer insulating film 102 may be made of an insulating material. For example, the first interlayer insulating film 101 and the second interlayer insulating film 102 may be made of high density plasma (HDP), tonen silazene (TOSZ), spin on glass (SOG), or undoped silica glass (USG).

The protective planarization layer 210 may be disposed, for example, in the second region R2 of the substrate 100. In exemplary embodiments of the present inventive concept, the protective planarization layer 210 may extend up to the first region R1 of the substrate 100. The protective planarization layer 210 may be disposed on the second surface 100b of the substrate 100. The protective planarization layer 210 may be a high-concentration impurity layer and may be doped with P-type impurities such as boron (B). However, the present inventive concept is not limited to this case, and the protective planarization layer 210 may also be formed as an oxide layer having negative charges. The protective planarization layer 210 can prevent a dangling-bond defect of silicon, a surface defect due to etching stress, or a depletion well resulting from a drop in the electrical potential of a surface adjacent to the substrate 100 due to an interface trap. In addition, the protective planarization layer 210 may provide an electric potential gradient to allow photocharges generated in an area adjacent to the substrate 100 to flow to the floating diffusion region FD.

The color filter layer 230 may be disposed in the second region R2 of the substrate 100. The color filter layer 230 may be disposed on the protective planarization layer 210. The color filer layer 230 may be disposed between the first semiconductor photoelectric converter PD1 and the microlens ML. The color filter layer 230 may include, for example, an insulating material and a color filter. When the color filter layer 230 includes a color filter, it may pass only light having a particular wavelength band among the incident light L.

The third interlayer insulating film 103 may be disposed in the first region R1 of the substrate 100. The third interlayer insulating film 103 may be disposed on the second surface 100b of the substrate 100. The third interlayer insulating film 103 may include an insulating material.

The microlens ML may be disposed in the second region R2 of the substrate 100. The microlens ML may be disposed on the color filter layer 230. The microlens ML may have a convex shape and a predetermined radius of curvature. The microlens ML may be made of, e.g., light-transmitting resin. The microlens ML may concentrate the light L on the second region R2 of the first pixel region PX1 of the substrate 100.

The first semiconductor photoelectric converter PD1 may be disposed within the second region R2 of the substrate 100. For example, the first semiconductor photoelectric converter PD1 may be disposed between the first surface 100a and the second surface 100b of the substrate 100. The first semiconductor photoelectric converter PD1 may be formed within the substrate 100 by doping the substrate 100 with impurities having a conductivity type opposite to that of the substrate 100. In addition, the first semiconductor photoelectric converter PD1 may have different impurity concentrations in its upper and lower parts so that it can have an electric potential gradient along a first direction. For example, the first semiconductor photoelectric converter PD1 may be formed as a stack of a plurality of impurity regions. Here, the first direction may be a direction from the second surface 100b of the substrate 100 toward the first surface 100a of the substrate 100. The first semiconductor photoelectric converter PD1 may receive the light L through the microlens ML and generate photocharges in proportion to the amount of the incident light L. The photocharges may be transferred to the floating diffusion region FD by the first transmission gate electrode 311.

Examples of the first semiconductor photoelectric converter PD1 may include a photodiode, a phototransistor, a photogate, a pinned photodiode (PPD), and combinations of these devices.

The floating diffusion region FD may be disposed within the second region R2 of the substrate 100. The floating diffusion region FD may be disposed at the first surface 100a of the substrate 100. For example, the floating diffusion region FD may be disposed within the substrate 100 on the side of the first surface 100a of the substrate 100. The floating diffusion region FD may be in contact with the first interlayer insulating film 101.

The first transmission transistor TTR1 may include the first transmission gate electrode 311, a first transmission gate insulating layer 312, first transmission gate spacers 313, and the floating diffusion region FD.

The first transmission transistor TTR1 may be disposed in the second region R2 of the substrate 100. The first transmission transistor TTR1 may be disposed at the first surface 100*a* of the substrate 100. The first transmission transistor TTR1 may overlap the first semiconductor photoelectric converter PD1 in a direction from the first surface 100*a* toward the second surface 100*b* of the substrate 100.

The first transmission gate electrode 311 may include a portion disposed in the substrate 100 and a portion disposed in the first interlayer insulating film 101. In addition, the portion of the first transmission gate electrode 311 disposed in the substrate 100 and the portion of the first transmission gate electrode 311 disposed in the first interlayer insulating film 101 may have different widths. However, exemplary embodiments of the present inventive concept are not limited to this case. For example, the entire first transmission gate electrode 311 may be disposed within the first interlayer insulating film 101.

The first transmission gate electrode 311 may include, for example, a conductive material. Examples of the conductive material may include doped polysilicon, titanium nitride (TiN), tantalum nitride (TaN), tungsten nitride (WN), titanium (Ti), tantalum (Ta), and tungsten (W).

The first transmission gate insulating layer 312 may be disposed between the first transmission gate electrode 311 and the substrate 100. The first transmission gate insulating layer 312 may include, for example, a high-k material. The high-k material may include, for example, hafnium oxide, hafnium silicon oxide, lanthanum oxide, or lanthanum aluminum oxide. However, exemplary embodiments of the present inventive concept are not limited to this case. For example, the first transmission gate insulating layer 312 may include a silicon oxide layer, a silicon nitride layer, or a silicon oxynitride layer.

The first transmission gate spacers 313 may be disposed on both sides of the first transmission gate electrode 311. For example, the first transmission gate spacers 313 may not extend into the substrate 100.

The first transmission gate spacers 313 may include, for example, SiN, SiON, SiO$_2$, SiOCN, or combinations of these materials.

The first transmission gate connection structure 319 may be disposed in the second region R2 of the substrate 100. The first transmission gate connection structure 319 may be disposed within the first interlayer insulating film 101 and the second interlayer insulting film 102. The first transmission gate connection structure 319 may include a first transmission gate contact 319*a* and a first transmission gate connection wiring 319*b*.

The first transmission gate contact 319*a* may be disposed within the first interlayer insulating film 101. The first transmission gate contact 319*a* may be connected to the first transmission gate electrode 311. For example, the first transmission gate contact 319*a* may be directly connected to the first transmission gate electrode 311. The first transmission gate contact 319*a* may connect the first transmission gate electrode 311 and the first transmission gate connection wiring 319*b*. The first transmission gate contact 319*a* may be directly connected to the first transmission gate connection wiring 319*b*. The first transmission gate connection wiring 319*b* may be disposed within the second interlayer insulating film 102.

The first transmission gate connection structure 319 may transmit the transmission control signal TX to the first transmission gate electrode 311. For example, the first transmission gate connection structure 319 may be connected to the power source that can apply a negative voltage. Therefore, the first transmission gate connection structure 319 may apply a negative voltage to the first transmission gate electrode 311.

The first transmission gate connection structure 319 may include a conductive material.

The first and second transistors TR1 and TR2 may be disposed in the first region R1 of the substrate 100. The first and second transistors TR1 and TR2 may be disposed at the first surface 100*a* of the substrate 100. The first and second transistors TR1 and TR2 may be spaced apart from each other. The first and second transistors TR1 and TR2 may be separated by an element isolation layer 401.

Each of the first and second transistors TR1 and TR2 may not overlap the first semiconductor photoelectric converter PD1. For example, each of the first and second transistors TR1 and TTR2 may not overlap the first semiconductor photoelectric converter PD1 in the direction from the first surface 100*a* toward the second surface 100*b* of the substrate 100.

In exemplary embodiments of the present inventive concept, the first and second transistors TR1 and TR2 may be NMOS transistors.

The first transistor TR1 may include the first gate electrode 411, a first gate insulating layer 412, first gate spacers 413 and first source/drain regions 415. The second transistor TR2 may include the second gate electrode 421, a second gate insulating layer 422, second gate spacers 423, and second source/drain regions 425.

Each of the first and second gate electrodes 411 and 421 may be disposed on the first surface 100*a* of the substrate 100. Each of the first and second gate electrodes 411 and 421 may be disposed within the first interlayer insulating film 101. The description of the gate electrode 121 made with reference to FIGS. 1 through 4 is applicable to the first and second gate electrodes 411 and 421.

The first and second gate insulating layers 412 and 422 may be disposed between the first and second gate electrodes 411 and 421 and the first surface 100*a* of the substrate 100, respectively. The description of the gate insulating layer 122 made with reference to FIGS. 1 through 4 is applicable to the first and second gate insulating layers 412 and 422.

The first and second gate spacers 413 and 423 may be disposed on both sidewalls of the first and second gate electrodes 411 and 421, respectively. The description of the gate spacers 123 made with reference to FIGS. 1 through 4 is applicable to the first and second gate spacers 413 and 423.

The first and second source/drain regions 415 and 425 may be disposed on at least one side of the first and second gate electrodes 411 and 421, respectively. Each of the first and second source/drain regions 415 and 425 may be disposed within the substrate 100. The element isolation layer 401 may be disposed between the first and second source/drain regions 415 and 425. The description of the source/drain regions 125 made with reference to FIGS. 1 through 4 is applicable to the first and second source/drain regions 415 and 425.

The element isolation layer 401 may be disposed within the substrate 100 in the first region R1 of the substrate 100. The element isolation layer 401 may be disposed between the first and second transistors TR1 and TR2 to insulate the first and second transistors TR1 and TR2 from each other. The element isolation layer 401 may include an insulating material.

The second separation pattern 152 may penetrate the substrate 100 to extend from the first surface 100a to the second surface 100b of the substrate 100. For example, the second separation pattern 152 may directly contact each of the first surface 100a and the second surface 100b of the substrate 100. The separation pattern 152 may be disposed at a first side of the first transistor TR1 and a second side of the second transistor TR2.

Although sidewalls of the second separation pattern 152 are substantially perpendicular to the first surface 100a of the substrate 100 in FIG. 10, exemplary embodiments of the present inventive concept are not limited to this case. For example, the sidewalls of the second separation pattern 152 may slope at any angle with respect to the first surface 100a of the substrate 100.

In exemplary embodiments of the present inventive concept, the second connection wiring structure 172 may be disposed on the first surface 100a of the first region R1 of the substrate 100. The second connection wiring structure 172 may directly contact the first surface 100a of the substrate 100.

For example, the second connection wiring structure 172 may include a second contact 172a and a second connection wiring 172b. The second contact 172a and the second connection wiring 172b may be in direct contact with each other.

The second contact 172a may be disposed in the first region R1 of the substrate 100 and may directly contact the first surface 100a of the substrate 100. The second contact 172a may be disposed on the substrate 100 exposed between the first and second transistors TR1 and TR2 and the second separation pattern 152 in the first region R1 of the substrate 100. The second contact 172a may be disposed within the first interlayer insulating film 101. The second connection wiring 172b may be disposed in the second interlayer insulating film 102 and connected to the second contact 172a.

The second connection wiring structure 172 may connect the first region R1 of the substrate 100 to the power source that can apply a negative voltage. For example, when the image sensor which is the semiconductor device according to the exemplary embodiments of the present inventive concept is driven, a negative voltage, in other words, a negative bias may be applied to the first region R1 of the substrate 100 through the second connection wiring structure 172. In addition, the second connection wiring structure 172 is not connected to the second region R2 of the substrate 100, and the first region R1 of the substrate 100 is insulated from the second region R2 by the second separation pattern 152. Therefore, a negative voltage may not be applied to the second region R2 of the substrate 100.

In the image sensor which is the semiconductor device according to the exemplary embodiments of the present inventive concept, since the first region R1 of the substrate 100 and the second region R2 of the substrate 100 are separated using the second separation pattern 152, a negative voltage can be directly applied only to the first region R1 of the substrate 100 through the second connection wiring structure 172. Since the negative voltage is applied only to the first region R1 of the substrate 100, the first and second transistors TR1 and TR2 can be driven with a low voltage.

In exemplary embodiments of the present inventive concept, the second connection wiring 172b may extend to, for example, the second region R2 of the substrate 100. When the second connection wiring 172b extends to the second region R2 of the substrate 100, it may be connected to the first transmission gate connection wiring 319b. In other words, the second connection wiring structure 172 may be connected to the first transmission gate contact 319a. Even if the second connection wiring structure 172 is connected to the first transmission gate contact 319a, a negative voltage may be applied to the first transmission gate electrode 311, but may not be applied to the second region R2 of the substrate 100.

The second connection wiring structure 172 may include a conductive material.

A semiconductor device according to exemplary embodiments of the present inventive concept will now be described with reference to FIGS. 5 through 9 and 11. For clarity of description, a description of elements identical to those described above will be omitted or given briefly.

Figure 11:
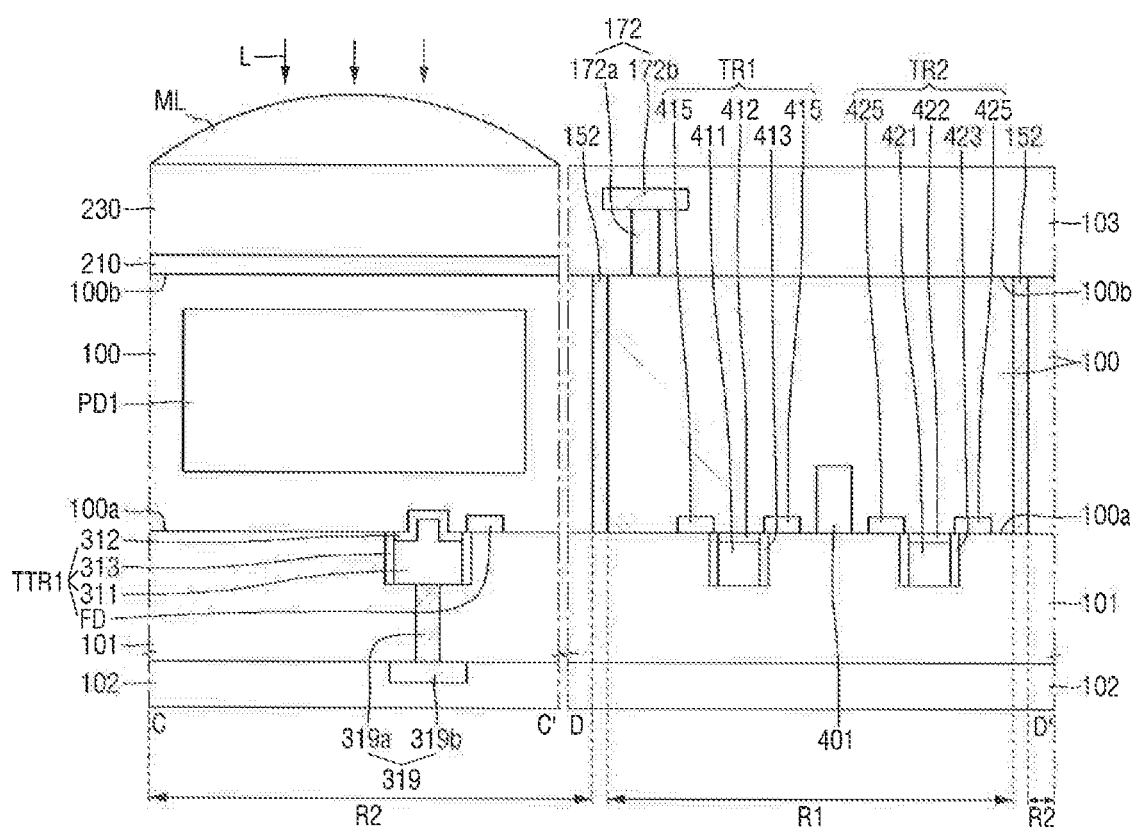

FIG. 11 is a cross-sectional view taken along lines C-C' and D-D' of FIG. 8.

Referring to FIGS. 5 through 9 and 11, a second connection wiring structure 172 of an image sensor which is the semiconductor device according to the exemplary embodiments of the present inventive concept may be disposed on a second surface 100b of a first region R1 of a substrate 100.

The second connection wiring structure 172 may directly contact the second surface 100b of the first region R1 of the substrate 100. The second connection wiring structure 172 may be disposed at any position on the second surface 100b of the first region R1 of the substrate 100. A second contact 172a and a second connection wiring 172b may be disposed within a third interlayer insulating film 103. The second contact 172a may be disposed in the first region R1 of the substrate 100 and directly contact the second surface 100b of the substrate 100. The second connection wiring structure 172 may connect the first region R1 of the substrate 100 to a power source that can apply a negative voltage.

A semiconductor device according to exemplary embodiments of the present inventive concept will now be described with reference to FIGS. 5, 9, and 12 through 14. For clarity of description, a description of elements identical to those described above will be omitted or given briefly.

Figure 12:
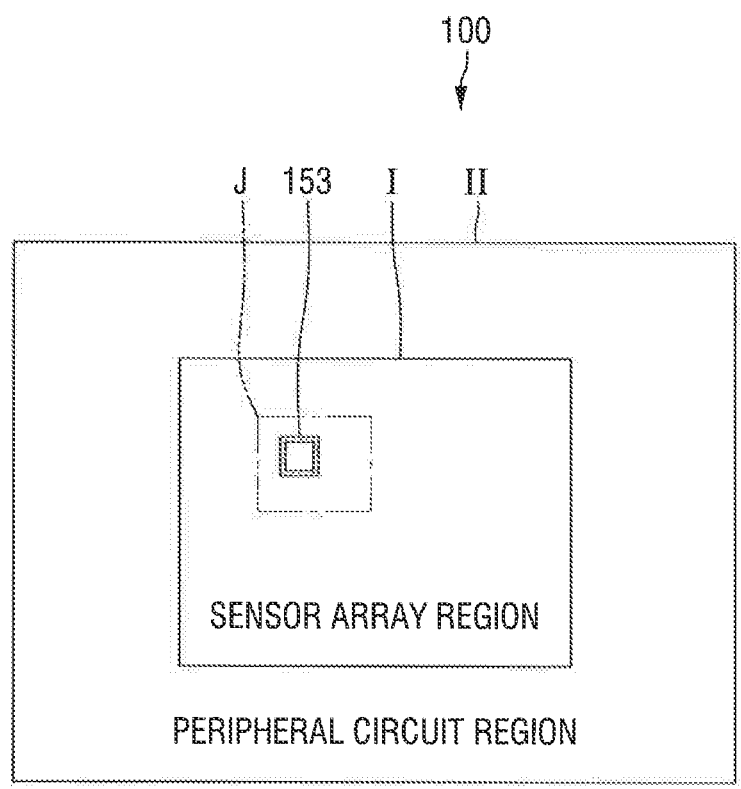
FIG. 12 illustrates regions of a substrate of a semiconductor device according to exemplary embodiments of the present inventive concept.
Figure 13:
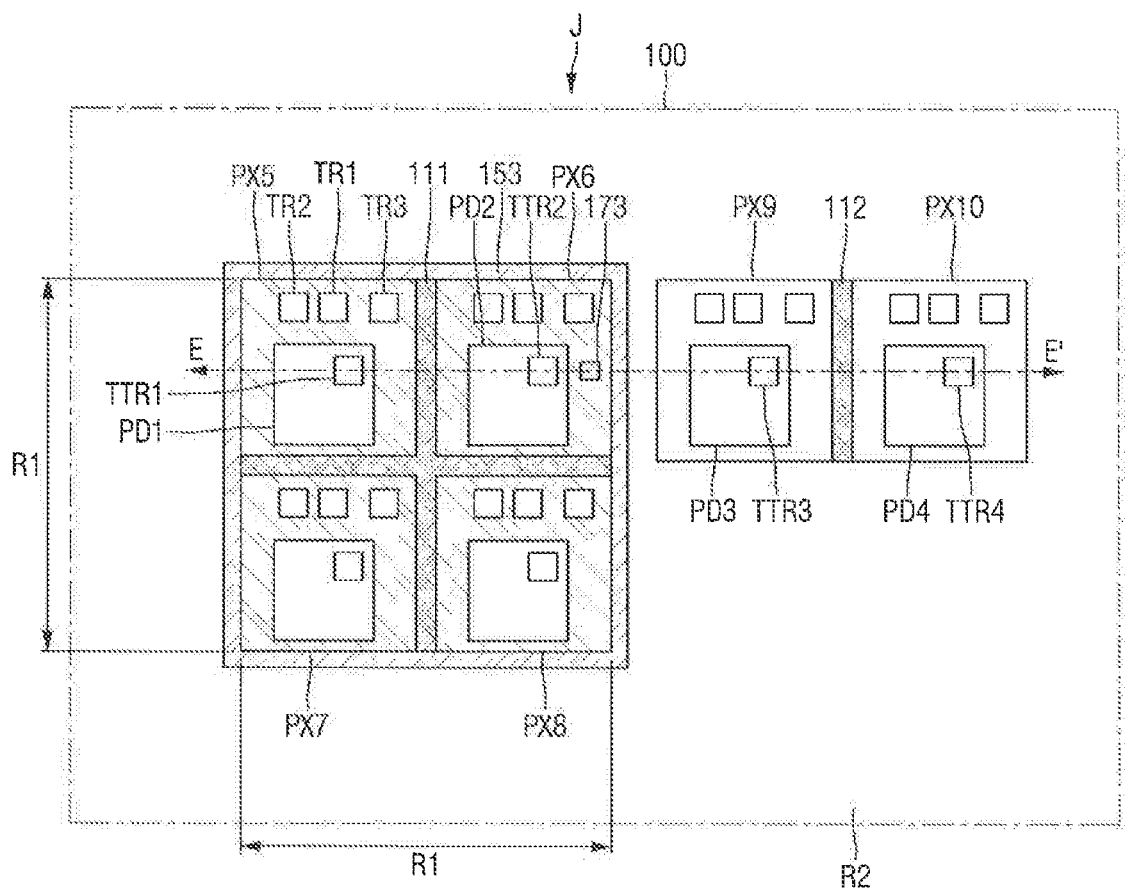
FIG. 13 is an enlarged view of an area J of FIG. 12.
Figure 14:
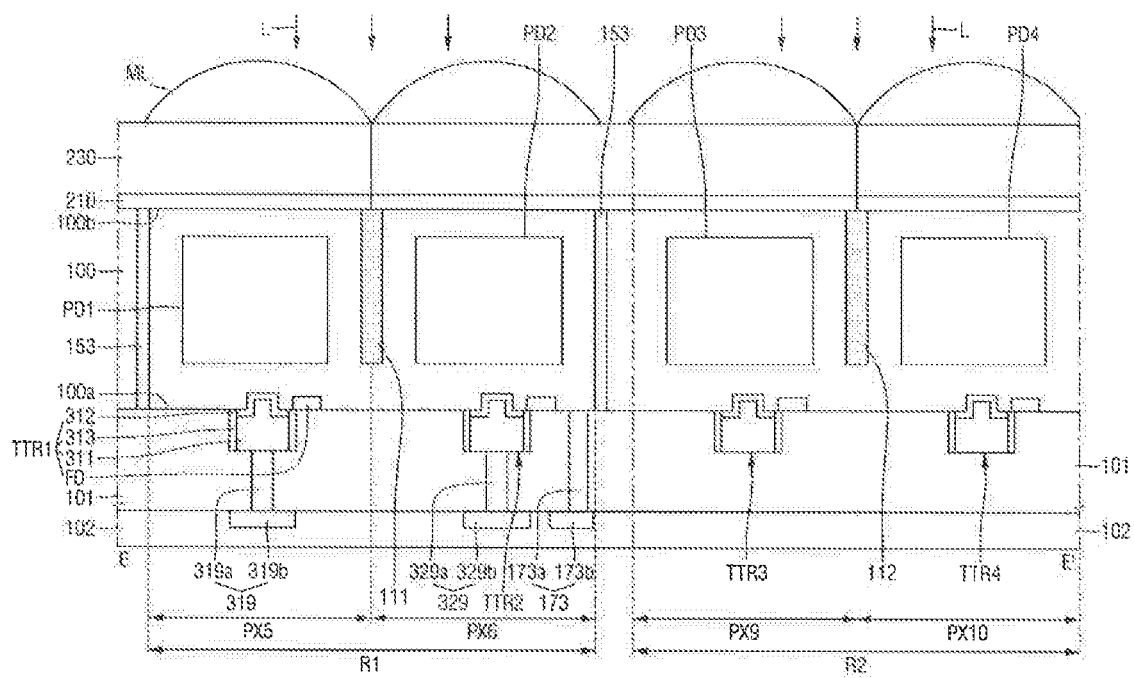
FIGS. 14 and 15 are cross-sectional views taken along line E-E' of FIG. 13, respectively.

FIG. 12 illustrates regions of a substrate 100 of a semiconductor device according to exemplary embodiments of the present inventive concept. FIG. 13 is an enlarged view of an area J of FIG. 12. In FIG. 13, a third connection wiring 173b (shown in FIG. 14) of a third connection wiring structure 173 is omitted for clarity of illustration. FIG. 14 is a cross-sectional view taken along line E-E' of FIG. 13. Since the description of the first pixel region PX1 is applicable to fifth, sixth, seventh, eighth, ninth and tenth pixel regions PX5, PX6, PX7, PX8, PX9 and PX10, differences will be mainly described below.

Referring to FIGS. 5, 9 and 12 through 14, some of a plurality of pixel regions included in an APS array 10 of a sensor array region I may be surrounded by a third separation pattern 153.

For example, the pixel regions included in the APS array 10 of the sensor array region I may include the fifth through tenth pixel regions PX5 through PX10. The fifth through eighth pixel regions PX5 through PX8 among the fifth through tenth pixel regions PX5 through PX10 may be surrounded by the third separation pattern 153.

The third separation pattern 153 may surround the fifth through eighth pixel regions PX5 through PX8 to form a first region R1 of the substrate 100 which is a closed region. The ninth and tenth pixel regions PX9 and PX10 may be disposed in a second region R2 of the substrate 100. The third separation pattern 153 may separate, for example, the fifth through eighth pixel regions PX5 through PX8 from the ninth and tenth pixel regions PX9 and PX10. The third separation pattern 153 may have a closed structure.

The third separation pattern 153 may penetrate the substrate 100 to extend from a first surface 100a to a second surface 100b of the substrate 100. For example, the third separation pattern 153 may directly contact each of the first surface 100a and the second surface 100b of the substrate 100.

Although four pixel regions are surrounded by the third separation pattern 153 in FIG. 14, this is only an example, and the present inventive concept is not limited to this example. For example, the third separation pattern 153 may surround any number of pixel regions among the pixel regions included in the APS array 10.

The fifth through eighth pixel regions PX5 through PX8 may be separated from each other by a first deep trench isolation (DT1) structure 111. The fifth and tenth pixel regions PX9 and PX10 may be separated from each other by a second DT1 structure 112.

The first DT1 structure 111 may be disposed within the substrate 100 in the first region R1 of the substrate 100. The second DT1 structure 112 may be disposed within the substrate 100 in the second region R2 of the substrate 100. The first and second DT1 structures 111 and 112 may extend from the second surface 100b of the substrate 100 to a part of the substrate 100. For example, the first and second DT1 structures 111 and 112 may extend from the second surface 100b of the substrate 100 to an area of the substrate 100 close to the first surface 100a of the substrate 100.

A first semiconductor photoelectric converter PD1, a second semiconductor photoelectric converter PD2, a first transmission transistor TTR1, and a second transmission transistor TTR2 may be disposed inside the third separation pattern 153. A third semiconductor photoelectric converter PD3, a fourth semiconductor photoelectric converter PD4, a third transmission transistor TTR3, and a fourth transmission transistor TTR4 may be disposed in the second region R2 of the substrate 100.

The first through fourth transmission transistors TTR1 through TTR4 may be disposed at the first surface 100a of the first region R1 and the second region R2 of the substrate 100. For example, the first through fourth transmission transistors TTR1 through TTR4 may be arranged along a line.

A second transmission gate connection structure 329 may include a second contact 329a and a second connection wiring 329b. The second transmission transistor TTR2 may receive a transmission control signal TX through the second transmission gate connection structure 329.

In exemplary embodiments of the present inventive concept, the third connection wiring structure 173 may be disposed on the first surface 100a of the first region R1 of the substrate 100. The third connection wiring structure 173 may directly contact the first surface 100a of the substrate 100.

For example, the third connection wiring structure 173 may include a third contact 173a and the third connection wiring 173b.

The third contact 173a may be disposed in the first region R1 of the substrate 100 and may directly contact the first surface 100a of the substrate 100. The third contact 173a may be, for example, disposed on the substrate 100 exposed between the second transmission transistor TR2 and the third separation pattern 153 in the first region R1 of the substrate 100. The third contact 173a may be disposed within a first interlayer insulating film 101. The third connection wiring 173b may be disposed within a second interlayer insulating film 102 and may be connected to the third contact 173a.

When the fifth through eighth pixel regions PX5 through PX8 are separated from each other by the first DT1 structure 111, the third connection wiring structure 173 may be disposed in any one of the fifth through eight pixel regions PX5 through PX8 which are pixel regions disposed inside the third separation pattern 153.

Although the third connection wiring structure 173 is disposed in the sixth pixel region PX6 in FIGS. 13 and 14, exemplary embodiments of the present inventive concept are not limited to this case. Any one of the fifth through eighth pixel regions PX5 through PX8 may include the third connection wiring structure 173. For example, when the third connection wiring structure 173 is disposed on the fifth pixel region PX5, the third contact 173a may be, for example, disposed on the substrate 100 exposed between the first transmission transistor TTR1 and the third separation pattern 153 in the first region R1 of the substrate 100. In addition, a greater number of the third connection wiring structures 173 can be provided.

The third connection wiring structure 173 may connect the first region R1 of the substrate 100 to a power source that can apply a negative voltage. For example, when an image sensor which is the semiconductor device according to the exemplary embodiments of the present inventive concept is driven, a negative voltage, in other words, a negative bias may be applied to the first region R1 of the substrate 100 through the third connection wiring structure 173. In addition, the third connection wiring structure 173 is not connected to the second region R2 of the substrate 100, and the first region R1 of the substrate 100 is insulated from the second region R2 by the third separation pattern 153. Therefore, a negative voltage may not be applied to the second region R2 of the substrate 100.

In the image sensor which is the semiconductor device according to the exemplary embodiments of the present inventive concept, since the first region R1 of the substrate 100 and the second region R2 of the substrate 100 are separated using the third separation pattern 153, a negative voltage can be directly applied only to the first region R1 of the substrate 100 through the third connection wiring structure 173. Since the negative voltage is applied only to the first region R1 of the substrate 100, the fifth through eighth pixel regions PX5 through PX8 can be driven with a low voltage. The ninth and tenth pixel regions PX9 and PX10 may be driven with a different voltage from the low voltage used to drive the fifth through eighth pixel regions PX5 through PX8.

In exemplary embodiments of the present inventive concept, the third connection wiring 173b may be connected to the first and second transmission gate connection structures 319 and 329. In this case, a negative voltage applied to transmission gate electrodes of the first and second transmission transistors TTR1 and TTR2 may also be applied to the first region R1 of the substrate 100 through the third connection wiring 173b.

The third connection wiring structure 173 may include a conductive material.

A semiconductor device according to exemplary embodiments of the present inventive concept will now be described with reference to FIGS. 5, 9, 12 and 13 through 15. For clarity of description, a description of elements identical to those described above will be omitted or given briefly.

Figure 15:
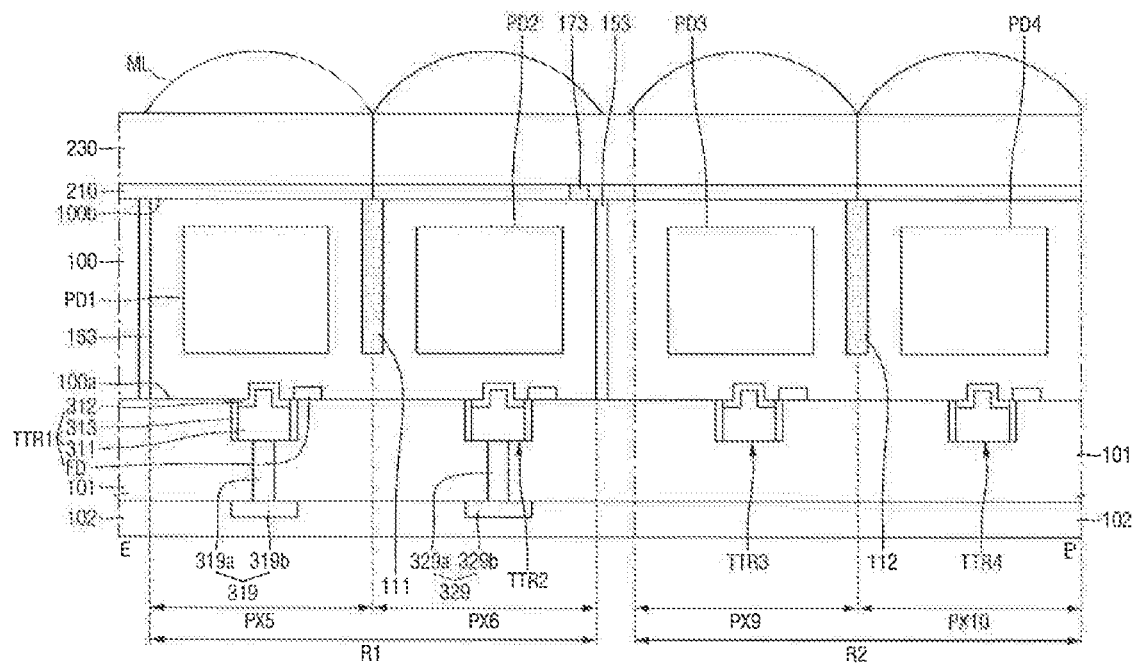

FIG. 15 is a cross-sectional view taken along line E-E' of FIG. 13.

Referring to FIGS. 5, 9, 12, 13 and 15, a third connection wiring structure 173 of an image sensor which is the semiconductor device according to the exemplary embodiments of the present inventive concept may be disposed on a second surface 100*b* of a first region R of a substrate 100.

The third connection wiring structure 173 may directly contact the second surface 100*b* of the substrate 100. The third connection wiring structure 173 may be disposed, for example, within a protective planarization layer 210. However, exemplary embodiments of the present inventive concept are not limited to this case. For example, the third connection wiring structure 173 may be disposed over the protective planarization layer 210 and a color filter layer 230. The third connection wiring structure 173 can have any shape as long as it can be connected to a power source that can apply a negative voltage to the first region R1 of the substrate 100.

In exemplary embodiments of the present inventive concept, the third connection wiring structure 173 may be an antireflection film. For example, the third connection wiring structure 173 can prevent light L passing through the color filter layer 230 from being reflected or scattered laterally.

The third connection wiring structure 173 may include a conductive material. For example, the third connection wiring structure 173 may include tungsten (W), aluminum (Al), or copper (Cu).

A semiconductor device according to exemplary embodiments of the present inventive concept will now be described with reference to FIGS. 5, 9, 12, 16 and 17. For clarity of description, a description of elements identical to those described above will be omitted or given briefly.

Figure 16:
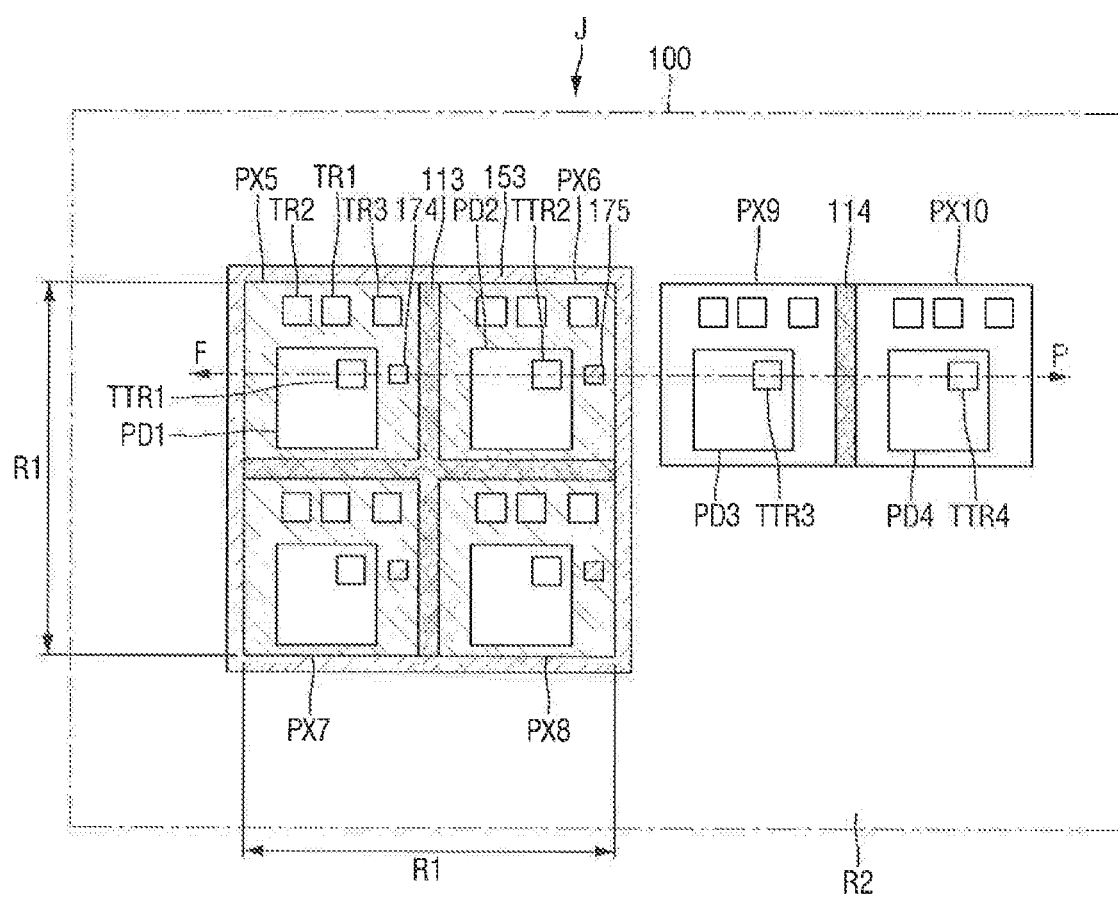
FIG. 16 is an enlarged view of the area J of FIG. 12.
Figure 17:
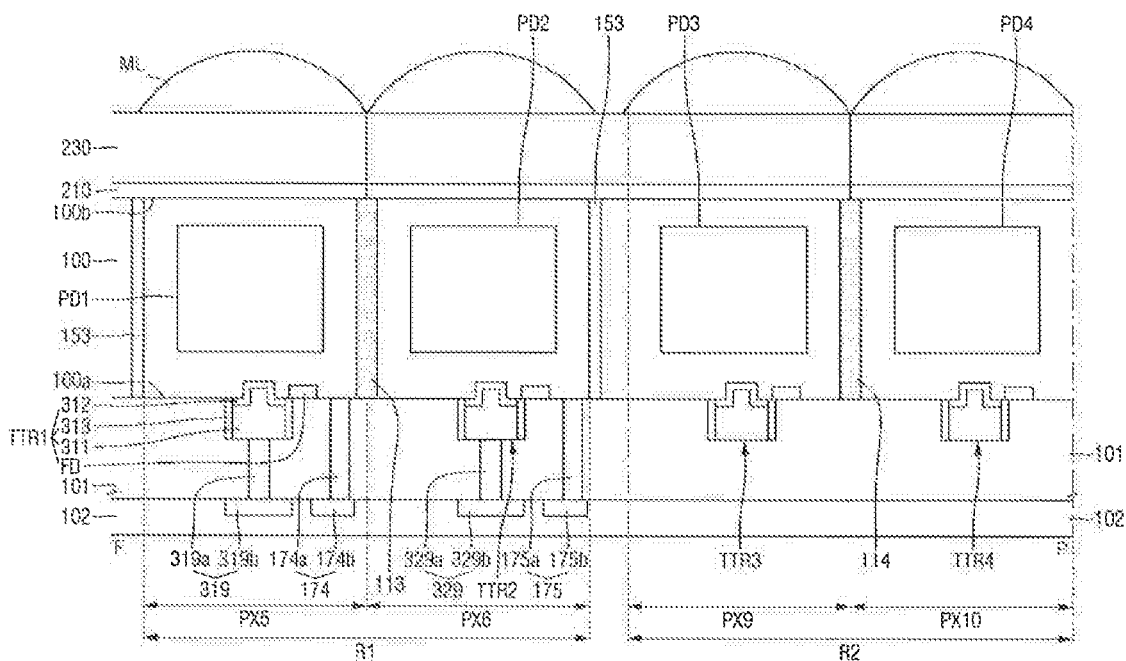
FIGS. 17 and 18 are cross-sectional views taken along line F-F' of FIG. 16, respectively.

FIG. 16 is an enlarged view of the area J of FIG. 12. In FIG. 16, fourth and fifth connection wirings 174*b* and 175*b* (shown in FIG. 17) of fourth and fifth connection wiring structures 174 and 175 are omitted for clarity of illustration. FIG. 17 is a cross-sectional view taken along line F-F' of FIG. 16.

Referring to FIGS. 5, 9, 12, 16 and 17, each of fifth through eighth pixel regions PX5 through PX8 may include a connection wiring structure connected to a power source that can apply a negative voltage to a first region R1 of a substrate 100. For example, the fifth and sixth pixel regions PX5 and PX6 may include the fourth and fifth connection wiring structures 174 and 175, respectively.

The fifth through tenth pixel regions PX5 through PX10 may be separated from each other by third and fourth DT1 structures 113 and 114. The third DT1 structure 113 may be disposed within the substrate 100 in the first region R1 of the substrate 100. The fourth DT1 structure 114 may be disposed within the substrate 100 in a second region R2 of the substrate 100. The third and fourth DT1 structures 113 and 114 may extend from a second surface 100*b* of the substrate 100 to a first surface 100*a* of the substrate 100. The third and fourth DT1 structures 113 and 114 may contact the first surface 100*a* and the second surface 100*b* of the substrate 100.

Since the third and fourth DT1 structures 113 and 114 extend from the second surface 100*b* of the substrate 100 to the first surface 100*a* of the substrate 100, each of the first through eighth pixel regions PX5 through PX8 may include a connection wiring structure to apply a negative voltage to the first region R1 of the substrate 100.

The description of the second connection wiring structure 172 made with reference to FIGS. 5 through 10 is applicable to the fourth and fifth connection wiring structures 174 and 175. Thus, differences will be mainly described below.

The fourth connection wiring structure 174 may be disposed in the first region R1 of the substrate 100. The fourth connection wiring structure 174 may be disposed between a third separation pattern 153 and the third DT1 structure 113. A fourth contact 174*a* of the fourth connection wiring structure 174 may directly contact the first surface 100*a* of the substrate 100 exposed between a first transmission transistor TTR1 and the third separation pattern 153 or between the first transmission transistor TTR1 and the third DT1 structure 113.

The fifth connection wiring structure 175 may be disposed in the first region R1 of the substrate 100. The fifth connection wiring structure 175 may be disposed between the third separation pattern 153 and the third DT1 structure 113. A fifth contact 175*a* of the fifth connection wiring structure 175 may directly contact the first surface 100*a* of the substrate 100 exposed between a second transmission transistor TTR2 and the third separation pattern 153 or between the second transmission transistor TTR2 and the third DT1 structure 113. The fourth and fifth connection wiring structures 174 and 175 may connect the first region R1 of the substrate 100 to the power source that can apply a negative voltage.

In exemplary embodiments of the present inventive concept, the fourth and fifth connection wirings 174*b* and 175*b* may be connected to the first and second transmission gate connection structures 319 and 329.

A semiconductor device according to exemplary embodiments of the present inventive concept will now be described with reference to FIGS. 5, 9, 12, 16 and 18. For clarity of description, a description of elements identical to those described above will be omitted or given briefly.

Figure 18:
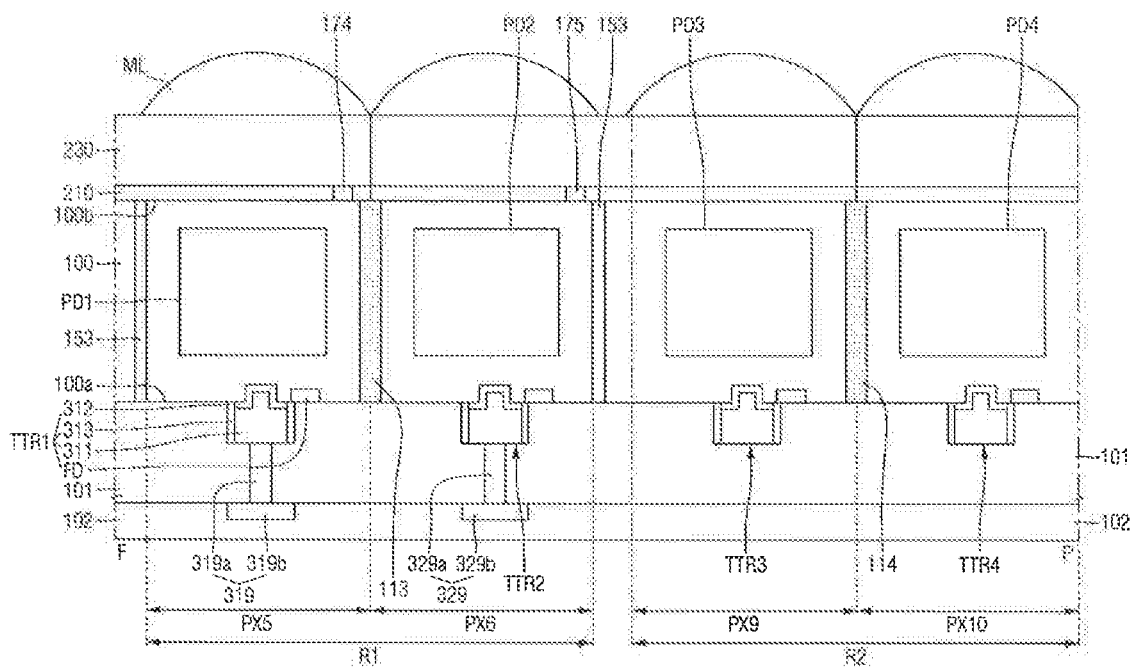

FIG. 18 is a cross-sectional view taken along line F-F' of FIG. 16.

Referring to FIGS. 5, 9, 12, 16 and 18, fourth and fifth connection wiring structures 174 and 175 may be disposed on a second surface 100*b* of a first region R1 of a substrate 100. The description of the second connection wiring structure 172 made with reference to FIG. 11 is applicable to the fourth and fifth connection wiring structures 174 and 175. Thus, differences will be mainly described below.

The fourth and fifth connection wiring structures 174 and 175 may directly contact the second surface 100*b* of the substrate 100. The fourth connection wiring structure 174 may directly contact the second surface 100*b* of the substrate 100 between a third separation pattern 153 and a third DT1 structure 113. The fifth connection wiring structure 175 may directly contact the second surface 100*b* of the substrate 100 between the third separation pattern 153 and the third DT1 structure 113. In exemplary embodiments of the present inventive concept, connection wirings may be omitted. For example, the fifth connection wiring structure 175 may be omitted.

Exemplary embodiments of the present inventive concept provide a semiconductor device which can reduce a leakage current and a driving voltage by applying a negative voltage to a specific region of a substrate.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. A semiconductor device, comprising:
a substrate having a first surface and a second surface facing, the first surface, wherein light is incident on the second surface, and wherein the substrate comprises a first region and a second region;
a pixel region formed in the substrate;
a semiconductor photoelectric convener disposed in the pixel region and the substrate;
one or more transistors disposed in the pixel region and at the first surface of the substrate, wherein the one or more transistors do not overlap the semiconductor photoelectric converter;
a separation pattern disposed in the pixel region and surrounding the one or more transistors;
a connection wiring structure disposed in the first region and connecting the first region to a power source;
a transmission gate electrode disposed in the pixel region and at the first surface of the substrate to overlap the semiconductor photoelectric converter; and
a transmission gate contact connected to the transmission gate electrode, wherein the connection wiring structure and the transmission gate contact are connected to each other,
wherein the first region is surrounded by the separation pattern and is a first part of the pixel region, the second region is a second part of the pixel region excluding the first region, and the semiconductor photoelectric converter is disposed in the second region.

2. The semiconductor device of claim 1, wherein the separation pattern penetrates the substrate and extends from the first surface of the substrate to the second surface of the substrate.

3. The semiconductor device of claim 1, wherein the connection wiring structure directly contacts the first surface of the substrate.

4. The semiconductor device of claim 1, wherein the connection wiring structure directly contacts the second surface of the substrate.

5. The semiconductor device of claim 1, wherein the one or more transistors do not overlap the semiconductor photoelectric converter in a direction from the first surface toward the second surface.

6. A semiconductor device, comprising:
a substrate which comprises a first region, a second region and a first surface and a second surface facing each other;
a pixel region formed in the substrate;
a semiconductor photoelectric convener disposed in the pixel region and the substrate;
a gate electrode disposed in the pixel region and at the first surface of the first region to overlap the semiconductor photoelectric convener;
a source/drain region disposed at the first surface of the first region and disposed on at least ono side of the gate electrode;
a separation pattern surrounding the first region to separate the first region from the second region, wherein the separation pattern penetrates the substrate and extends from the first surface of the substrate to the second surface of the substrate;
a connection wiring structure disposed in the first region connecting the first region to a power source that can apply a negative voltage; and
a gate contact connected to the gate electrode, wherein the connection wiring structure and the gate contact are connected to each other,
wherein the first region is a first part of the pixel region, the second region is a second part of the pixel region excluding the first region, and the semiconductor photoelectric convener is disposed in the second region.

7. The semiconductor device of claim 6, wherein the first region is a closed region formed by the separation pattern.

8. The semiconductor device of claim 6, wherein the connection wiring structure is disposed in the first region and directly contacts the second surface of the substrate in a closed region formed by the separation pattern.

9. The semiconductor device of claim 6, wherein the connection wiring structure directly contacts the first surface of the substrate exposed between the separation pattern and the source/drain region.

* * * * *